United States Patent
Bonora et al.

(10) Patent No.: US 7,293,811 B2
(45) Date of Patent: Nov. 13, 2007

(54) ULTRA LOW CONTACT AREA END EFFECTOR

(75) Inventors: Anthony C. Bonora, Woodside, CA (US); Roger G. Hine, Menlo Park, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 11/404,536

(22) Filed: Apr. 14, 2006

(65) Prior Publication Data

US 2006/0181095 A1    Aug. 17, 2006

(51) Int. Cl.
*A47J 45/00* (2006.01)
(52) U.S. Cl. ..................... 294/64.1; 414/941
(58) Field of Classification Search ............... 294/64.1, 294/64.2, 64.3; 414/935–941; 901/40
See application file for complete search history.

(56) References Cited

U.S. PATENT DOCUMENTS

| | | | |
|---|---|---|---|
| 4,620,738 A * | 11/1986 | Schwartz et al. .......... 294/64.1 |
| 6,183,026 B1 * | 2/2001 | Cai et al. .................... 294/64.1 |
| 6,244,641 B1 * | 6/2001 | Szapucki et al. ........... 294/64.1 |
| 6,942,265 B1 * | 9/2005 | Boyd et al. ................. 294/64.1 |
| 7,104,578 B2 * | 9/2006 | Hartog ........................ 294/64.1 |
| 2004/0100110 A1 * | 5/2004 | Baumann et al. ........... 294/64.1 |
| 2005/0110292 A1 * | 5/2005 | Baumann et al. ........... 294/64.1 |

* cited by examiner

*Primary Examiner*—Gene O. Crawford
*Assistant Examiner*—Esther O Okezie
(74) *Attorney, Agent, or Firm*—Martine Penilla & Gencarella, LLP

(57) ABSTRACT

The present invention comprises a vacuum end effector having workpiece supports that work in conjunction with distorted workpiece surfaces. In one embodiment, each workpiece support has the ability to gimbal and conform the workpiece surface in contact with an outer edge of the support. Each workpiece support preferably provides a knife-like contact edge to minimize the contact area between the support and the workpiece while still providing an effective vacuum area to hold the wafer securely on the support. In another embodiment, each workpiece support is replaceable without having to remove the end effector from the robot assembly

8 Claims, 10 Drawing Sheets

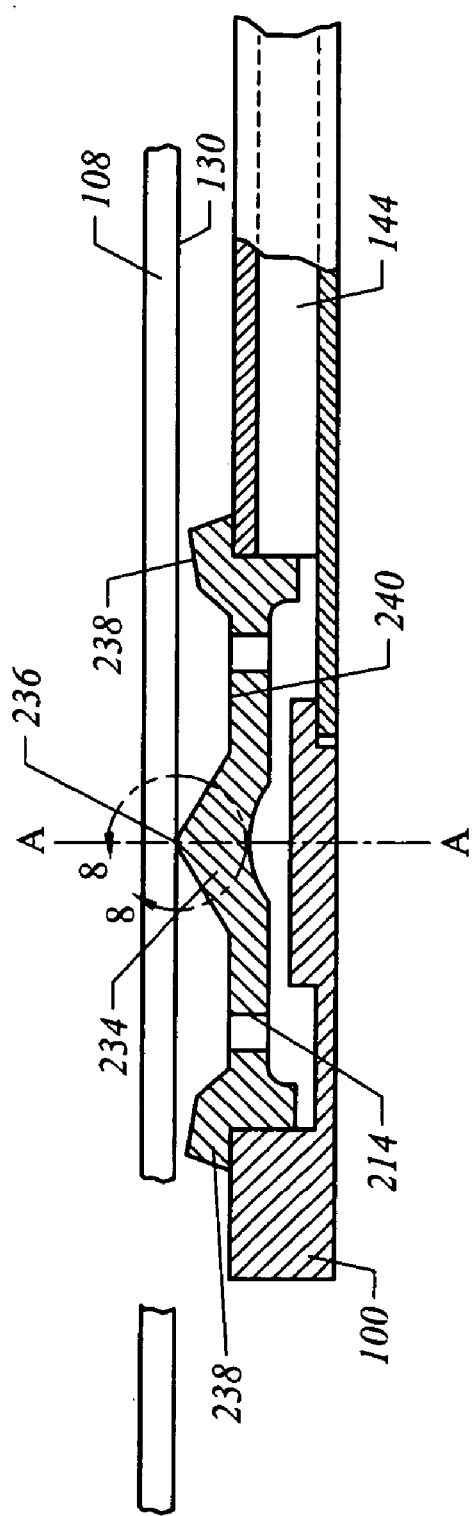
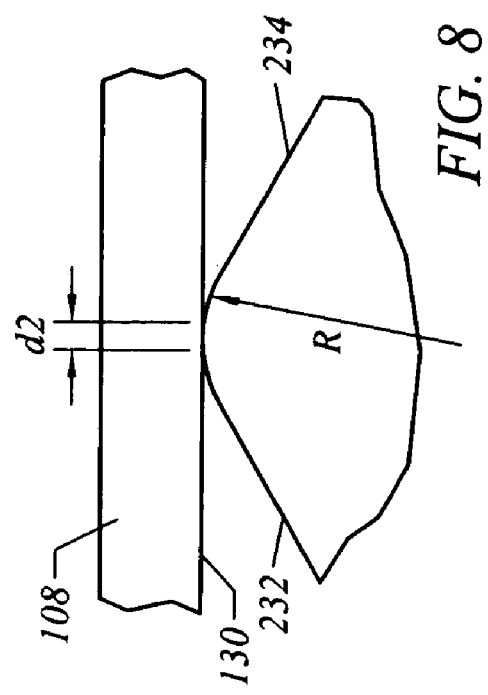
FIG. 7
FIG. 8

ULTRA LOW CONTACT AREA END EFFECTOR

CLAIM OF PRIORITY

This application claims priority under 35 U.S.C. §120 to U.S. patent application Ser. No. 10/888,819, entitled "Ultra Low Contact Area End Effector," filed with the U.S. Patent & Trademark Office on Jul. 10, 2004, which claims priority to U.S. Provisional Patent Application Ser. No. 60/486,330, now abandoned, both of which are assigned to Applicants and are incorporated herein by reference.

FIELD OF THE INVENTION

The present invention generally relates to an end effector for handling semiconductor workpieces. More particularly, the present invention relates to a vacuum gripping end effector that provides minimal contact between the workpiece supports and the backside of the workpiece.

BACKGROUND OF THE INVENTION

Conventional robotic vacuum chuck end effectors transfer significant particulate contamination to the backside of the wafer at areas where the chuck contacts the backside of the wafer. Vacuum grips often cause backside contamination and/or damage to a wafer due to: (1) scratching the backside of the wafer—particularly from hard ceramic or anodized aluminum contacts; (2) particles from the grip pad that are worn off and left on bottom of wafer; and (3) particles that fall onto the grip pad and are pressed onto bottom of wafer. Vacuum chuck end effectors also have difficulty achieving a low leak rate vacuum seal if the wafer placed on the end effector is warped or imperfectly aligned with the end effector surfaces.

Edge support or edge grip end effectors minimize the amount of particulate contamination transferred to the backside of the wafer. Edge grip end effectors, however, present difficulties in accurate wafer pick up and transfer and edge damage and/or contamination.

Gripping the perimeter edge of the wafer requires that structural features protrude from the upper surface of the end effector to a sufficient height such that the protrusions extend above the top surface of the wafer being gripped. This method also requires features to actuate the protrusions, extending and contracting them as required, which increases complexity and failure modes. Further, either the protrusion must be left as a remnant of a thicker piece of raw material than would otherwise be necessary, or the protrusions have to be attached to the end effector. The first method involves more raw material and machining. Also, these protrusions are not replaceable. The second method involves multiple parts and potentially complex permanent assembly methods, such as those discussed above. Edge gripping structures, however, can be expected to be relatively thick, and therefore difficult to maneuver through vertical stacking cassettes where the wafers are stored because the separation between wafers is on the order of only about 5-10 mm.

There are increasing uses for ultra-thin wafers—low profile chip designs, direct mount on boards, etc. These wafers are often less than 250 microns thick and are subjected to distortion and waviness. This presents challenges for handling thin substrates—which are conventionally not suitable for edge-grip technology end effectors.

One constraint with thin wafers includes ensuring that the vacuum source does not apply too much vacuum to the bottom surface of the wafer. A full 10-15 psi vacuum source, for example, will likely cause the wafer to warp. It is important, however, that the circular edge conform to the bottom surface of the wafer.

Accordingly, there is a need for a low profile vacuum end effector that includes workpiece supports that work in conjunction with distorted wafer surfaces. It is also desirable for the end effector to accommodate a wide variety of support materials and reliably retain the pads in place, while permitting damaged or worn supports to be readily replaced.

SUMMARY OF THE INVENTION

One aspect of the present invention is to provide an end effector that eliminates or greatly minimizes particulate transfer to the backside of the wafer. In one embodiment, the workpiece chucks or supports include a circular knife-like edge that provides the only contact between the wafer support and the wafer.

Another aspect of the present invention is to provide an end effector that includes self-aligning vacuum chucks or supports. The workpiece supports accommodate any lack of wafer planarity and work in conjunction with distorted wafer surfaces. The supports provide an effective vacuum seal under the conditions of lack of planarity between the backside of the wafer and the vacuum supports.

Still another aspect of the present invention is to provide an end effector that includes replaceable workpiece supports. In one embodiment, each workpiece support may be readily exchanged without having to remove the end effector from the robot assembly. The workpiece supports may comprise, by way of example only, a ceramic, a plastic, or a metal. The workpiece support preferably comprises a material suited for the type of workpiece that end effector will be handling.

Another aspect of the present invention is to provide an end effector that minimizes or eliminates the amount of deformation and/or stress induced into the workpiece transferred by the end effector, with particular respect to fragile workpieces (e.g., thin wafers, SOI wafers, etc.). Even though the contact area between the workpiece support and the wafer is very small, the workpiece support provides a sufficiently large effective vacuum surface to hold the workpiece on the end effector.

Still another aspect of the present invention is to provide an end effector that provides a choice of manufacturing approaches for the workpiece supports. The workpiece supports, by way of example only, may be manufactured through a machining, injection molding, plating, or chemical milling process.

BRIEF DESCRIPTION OF THE DRAWINGS

FIG. 7 is a side cut-away view, illustrating another embodiment of a workpiece support, according to the present invention;

FIG. 8 is a partial side view of the workpiece support shown in FIG. 7;

DETAILED DESCRIPTION OF THE INVENTION

The bottom surface of end effector, in many embodiments, comprises a membrane. The membrane seals the bottom surface of the end effector and forms a vacuum cavity under the wafer support.

Figure 1:
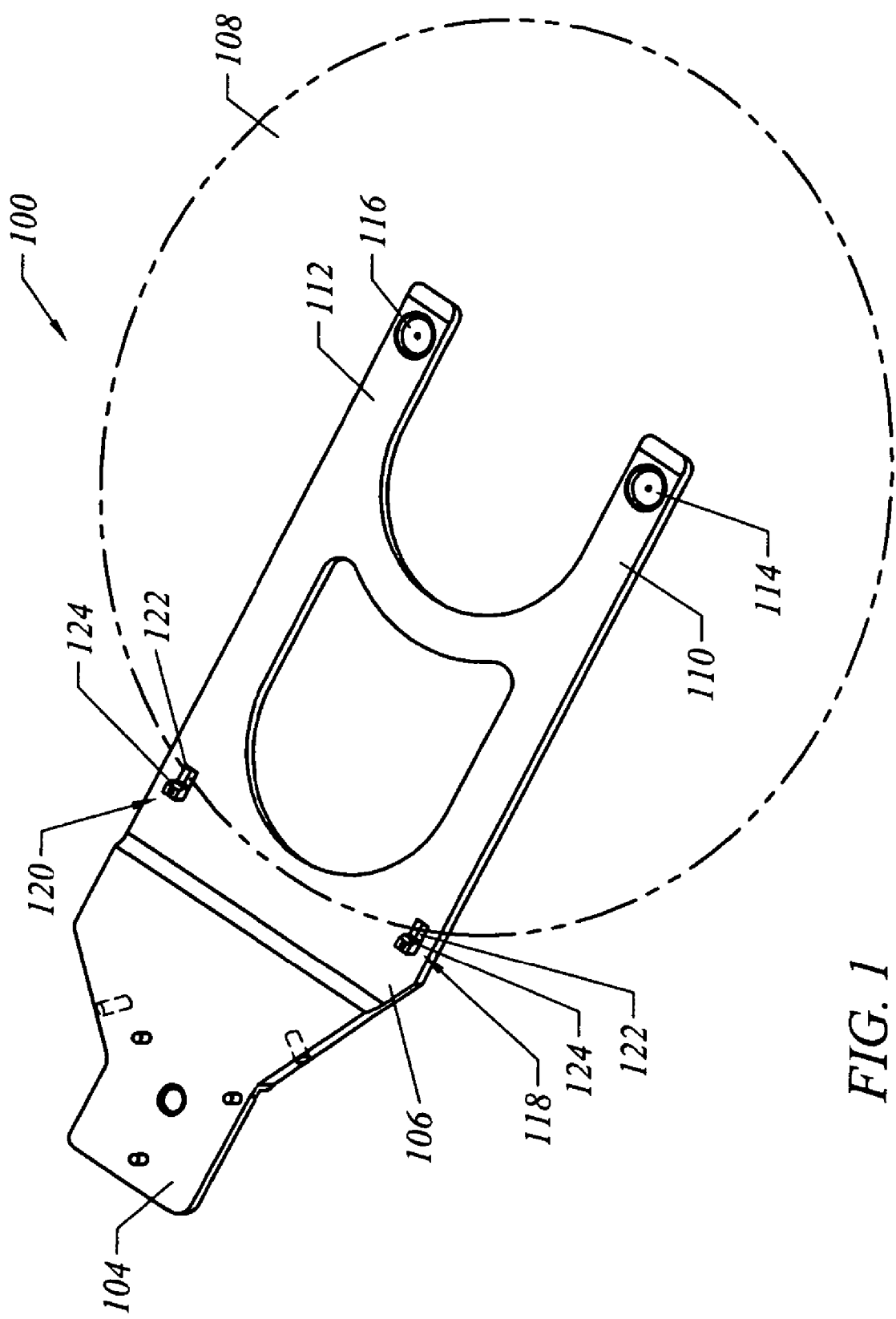
FIG. 1 is a perspective view of an embodiment of the present invention.

The present invention will now be described with reference to FIGS. 1-11. In general, the present invention comprises an end effector 100 having a combination of workpiece or wafer supports that contact the wafer in zones where particulate contamination is less critical, such as, for example, the outer edge of the wafer. In another embodiment, one or more wafer supports are used with accommodation for lack of co-planarity achieved by allowing the support(s) to tilt as required. FIG. 1 illustrates that the end effector 100 includes two wafer supports 114 and 116 in front of the center of gravity of the wafer 108. It is within the spirit and scope of the invention to have more than or fewer than two supports on the end effector.

A very low contact area circumferential sealing feature is utilized. The wafer supports 114 and 116 provide a knife-edged or small radius contact geometry, thus reducing the contact area between the wafer support chuck 114 and 116 and the wafer's backside 130 (and the potential for particulate transfer).

The end effector 100, in a first embodiment, includes a first end 104 adapted to secure to a wafer handling robot and a second end or platen 106 for supporting the wafer 108. The platen 106 includes a first finger 110 and a second finger 112. The first and second fingers 110, 112 are preferably spaced apart so that the first wafer support 114 and the second wafer support 116 contact different areas of the backside of the wafer 108. For ease of describing the embodiments of the invention, wafer support or chuck 114 will often be referenced throughout. Any attributes of wafer support or chuck 114 of course apply to wafer support 116. In this embodiment, the wafer 108 is also supported by first and second edge supports 118, 120. The platen 106 may include any number of fingers.

Figure 2A:
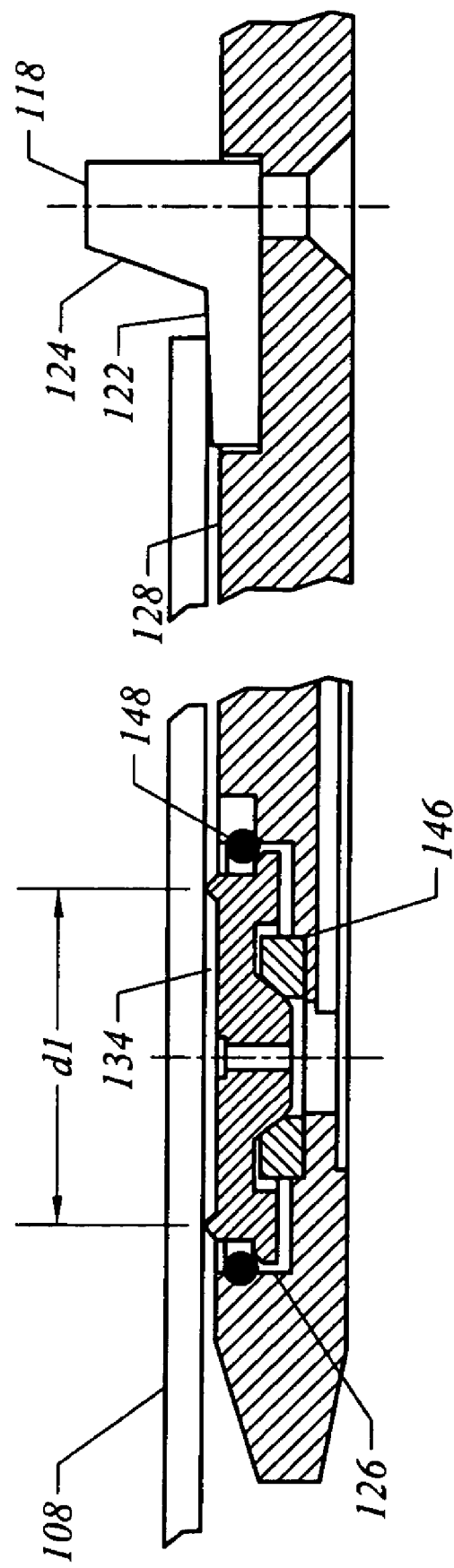
FIGS. 2A-2B are side sectional views of an embodiment of the present invention, illustrating one embodiment of a workpiece support.
Figure 2B:
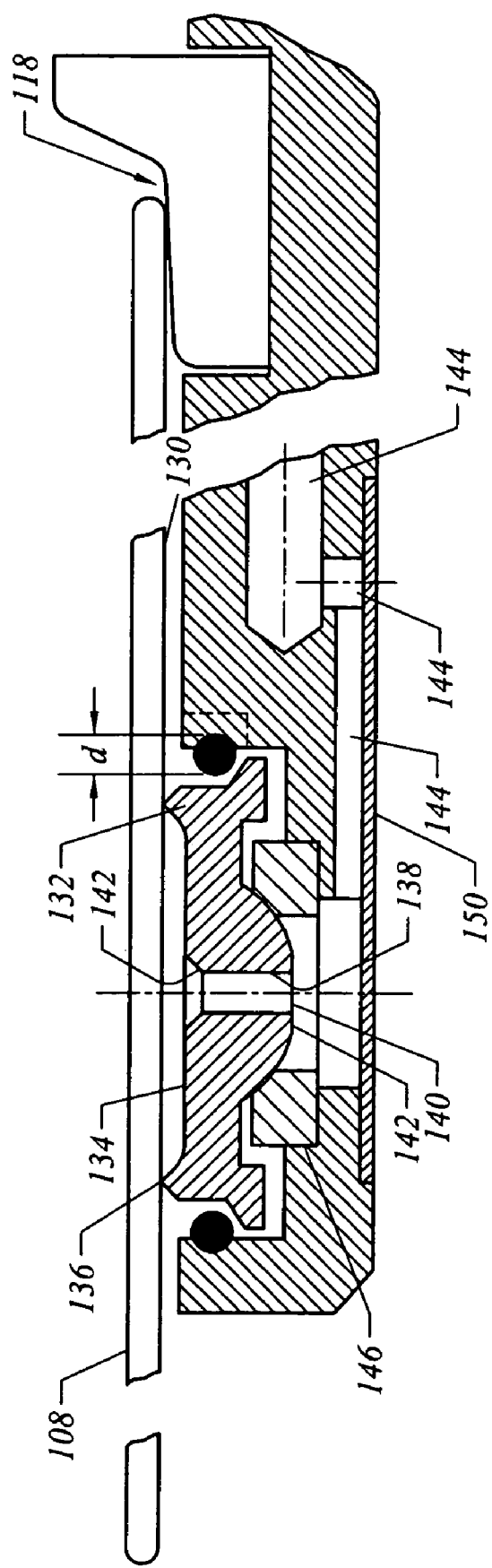
Figure 3:
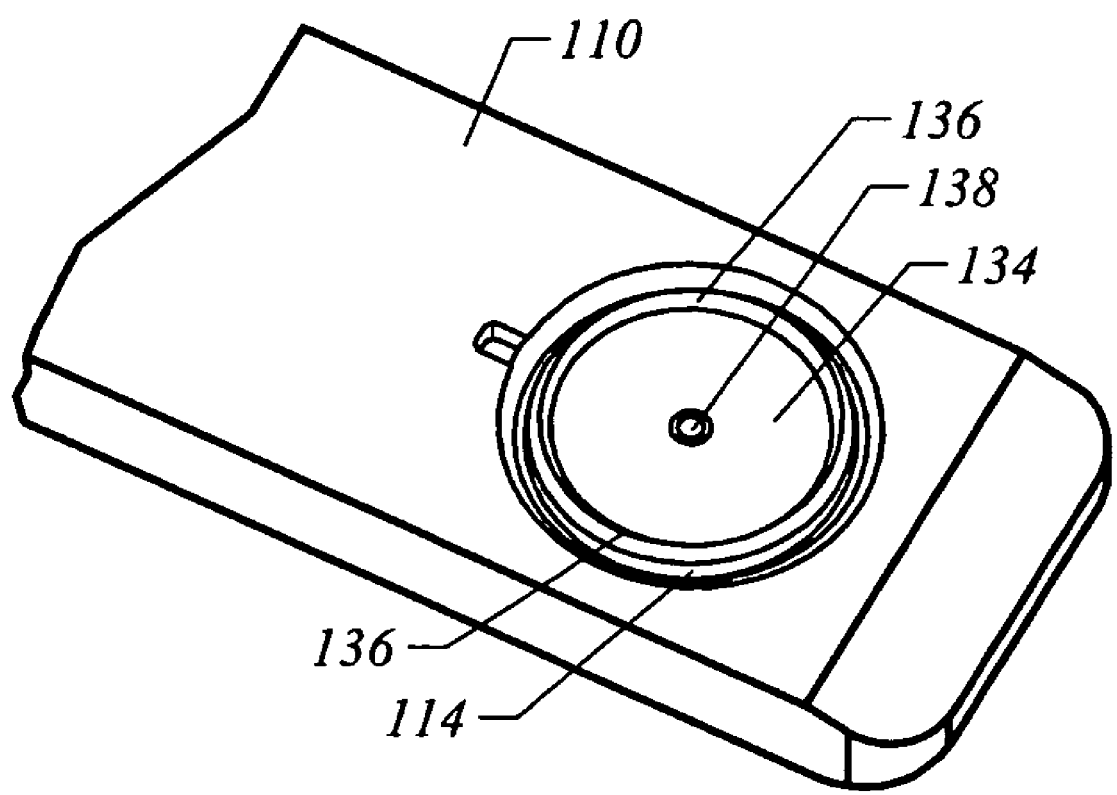
FIG. 3 is a detailed perspective view of the workpiece support shown in FIGS. 2A-2B.

FIGS. 2A-2B illustrates that the first and second edge supports 118, 120 preferably only contact the wafer 108 along its edge or periphery. Each edge support includes a wafer support surface 122 and a backstop 124. The wafer support surface 122 is stationary and preferably comprises a low friction non-particulate generating material.

The end effector 100 includes a support retention area 126 for supporting each wafer support 114 and 116. The support retention area 126 is a partial bore or recessed pocket. The support 114 and 116 is used to support the wafer 108 and keep the wafer 108 from contacting the surface 128 of the end effector 100. By preventing the wafer 108 from contacting the top surface 128 of the end effector 100, the wafer 108 is protected from contamination by the end effector 100 during handling.

The pivoting ball and socket joint 146 eliminates or greatly minimizes the lateral scrubbing of the wafer support chuck contact area 136 due to the tilting action.

FIGS. 2A-2B illustrates a first embodiment of a wafer support 114. In this embodiment, the wafer support 114 has a circular raised edge 132 that contacts the wafer's backside 130. The central region 134 of the wafer support chuck 114 is recessed below the contact portion 136 of the raised edge 132 so that only the contact portion 136 contacts the wafer's backside 130. The center region 134 includes a bore 138 that extends completely through the wafer support 114. The bore 138 extends from the bottom surface 142 of the wafer support 114 toward the central region 134. When the bore 138 approaches the central region 134, the bore 140 begins to taper outward such that the diameter of the bore 138 at the central region 134 is larger than the diameter of the bore 138 at the bottom surface 142.

Figure 4A:
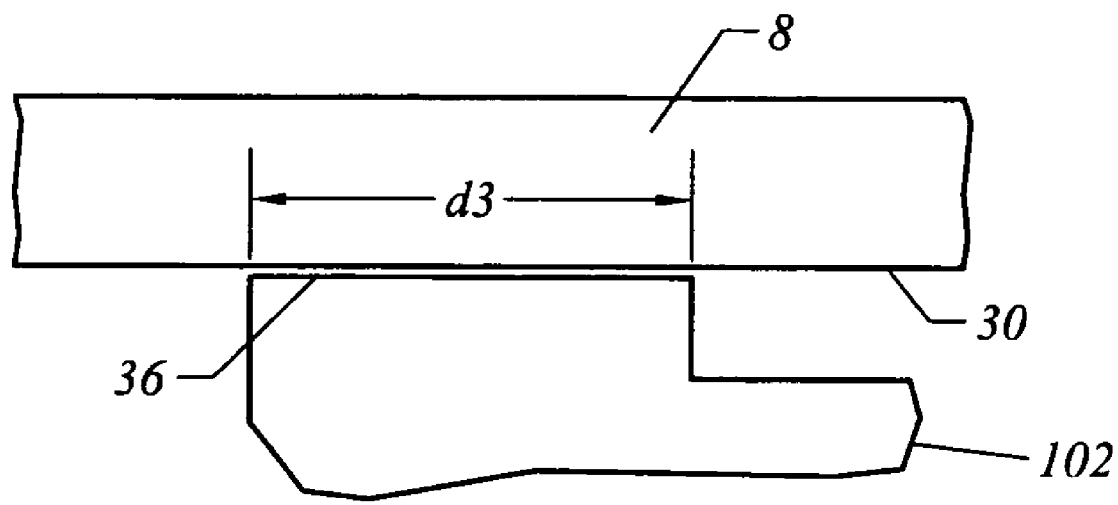
FIGS. 4A-4B are representative drawings, illustrating the contact area between a wafer and a workpiece support for an end effector according to the prior art and an end effector, utilizing the workpiece support according to the present invention.
Figure 4B:
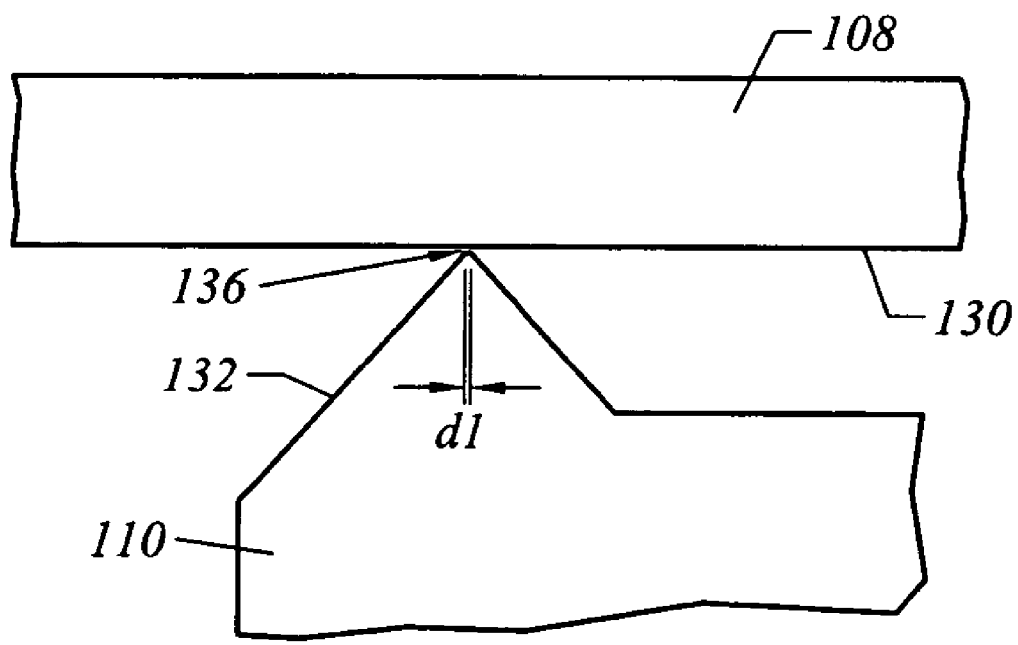

The wafer support 114 and 116, therefore, are only in contact with the wafer by a distance d1 (see FIG. 4B). The raised edge 132, by forming a seal with the wafer's backside 130, forms a vacuum seal with the wafer's backside 130 across an effective diameter d (see FIG. 2A). A vacuum passage 144 (see FIG. 5) travels through each finger 110, 112, and terminates substantially beneath the wafer support 114 and 116. FIG. 2B illustrates that a passageway from a vacuum source is provided by the vacuum passage 144 and the bore 138. In a preferred embodiment, the wafer support 114 and 116 forms a substantially air-tight seal with the wafer's backside 130 and the pivot socket 146 when the vacuum and source is activated or turned on.

The circular edge 132 must have a diameter large enough so that the vacuum provides a force large enough to hold the wafer 108 on the wafer support 114 and 116. A smaller diameter support, however, better accommodates any localized non-flatness of the wafer. If, for example, the wafer support 114 and 116 includes a circular edge 132 four inches in diameter, the wafer support 114 and 116 may still leak even with the gimbaling features. By achieving a good seal with a small diameter circular edge, the wafer support imparts maximum efficiency of the available vacuum force.

The wafer supports 114 and 116 and the edge supports 118 are located such that the wafer's center-of-gravity falls within the supports. This configuration ensures a stable condition for the wafer 108 prior to activating the vacuum source. The wafer supports 114 and 116 preferably comprise a low friction material so that the weight of the wafer 108 is sufficient to gimbal the wafer support chuck 114 and 116 to an optimum conformance to the wafer's bottom surface.

The wafer support 114 and 116 also prevents any lateral motion by the wafer 108 or the chuck 114 itself when the vacuum is applied. The lack of motion is particularly important when high accuracy transfers/hand-offs are required, such as between a wafer prealigner and a metrology or process station. In the semiconductor industry, transfer accuracy requirements are currently less than 25 microns and will likely continue to decrease.

The wafer supports 114 may comprise different material (e.g., ceramic for high temperature applications) and are easily replaceable. An operator may change out a wafer support 114 without affecting the structure of the end effector 100.

The actuation of vacuum simultaneously pulls the wafer's backside 130 against the sealing surface 136 of the support 114 and brings the support 114 into contact with the pivot socket 146. The pivot socket 146, by way of example only, primarily serves four functions: (1) enables tilting motion of the wafer support chuck 114 for optimum sealing between the wafer support chuck 114 and the backside of the wafer; (2) provides vertical support for the wafer support chuck 114 and a wafer 108 seated on the chuck 114; (3) provides self-actuated vacuum sealing of the pivot socket 146 due to force exerted by projected area when vacuum is applied; and (4) provides accurate and unambiguous location of a wafer 108 seated on the wafer support chuck 114 due to the chuck's self-centering design.

The geometry of the wafer support 114 provides a center of rotation that is coincident with the wafer support plane. This feature is defined as zero scrub radius. The wafer support 114 and the pivot socket 146 comprise a gimbal joint. A gimbal joint represents a composite joint with three rotational degrees-of-freedom.

If the wafer support 114 is gimbaling or pivoting, the instantaneous center of gimbaling is where the centerline is drawn (centerline of spherical surface). If the center of rotation of the wafer support 114 is positioned correctly, the center of rotation of the wafer support 114 is coincident with wafer support plane. Small angles of deflection create substantially no lateral sliding of the wafer support 114 against the wafer 108, even if there is angular misalignment between the wafer support 114 and the wafer 108. The center of rotation of the wafer support 114 may be higher/lower than that shown in FIG. 2B, however, the wafer support 114 will likely generate more particulates.

The wafer support 114 is seated in the pivot socket 146. Once a vacuum source is activated, the projected area of the wafer support 114 in contact with the pivot socket 146 sucks the wafer support 114 against the pivot socket 146. An o-ring, having a diameter slightly smaller than the diameter of the wafer support 114, ensures that the wafer support 114 remains in the pivot socket 146. The retaining feature may also comprise a coil or leaf spring.

Each wafer support 114 may wiggle because there is a clearance between the o-ring/clip and the edge of the support. The wafer support 114 conforms to the bottom surface of a wafer seated on the end effector. The wafer support 114, once the vacuum source is activated, remains substantially in the same position until the vacuum source is turned off. If a wafer 108 settles down on the wafer support 114 at an angle, for example, the wafer support 114 will comply with the backside of the wafer (e.g., the wafer remains at the angle relative to the end effector).

When the vacuum source is turned on, for example, the circular edge 132 of the wafer support 114 forms a seal with the bottom surface of the wafer. For example, if the end effector 100 raises up to the backside 130 of the wafer 108, the wafer support 114 gimbals until the circular edge 132 makes 360° contact with wafer backside 130. The entire circular edge 132 preferably forms a seal with wafer backside 130. As previously discussed, the contact surface between the circular edge 132 and the wafer 108 should be knife-like (e.g., contact distance of less than 0.05 mm). Basically, the contact area between the circular edge 132 and the wafer 108 is preferably very small.

FIGS. 4A-4B illustrate the contact area between a wafer support 114 and the backside of the wafer. A conventional wafer support, as shown in FIG. 4A, includes a circular edge 36, having a width d3. Thus, a large contact area is formed between the wafer support and the wafer 8. FIG. 4B illustrates the knife-like contact edge 136 of a wafer support 114 according to one embodiment of the present invention. The contact edge 136 only contacts the backside 130 of the wafer 108 by a distance d1. In comparison with the conventional wafer support, the distance d1 is much smaller than the distance d3—achieving a minimal contact area between the wafer support 114 and the wafer 108.

Figure 5:
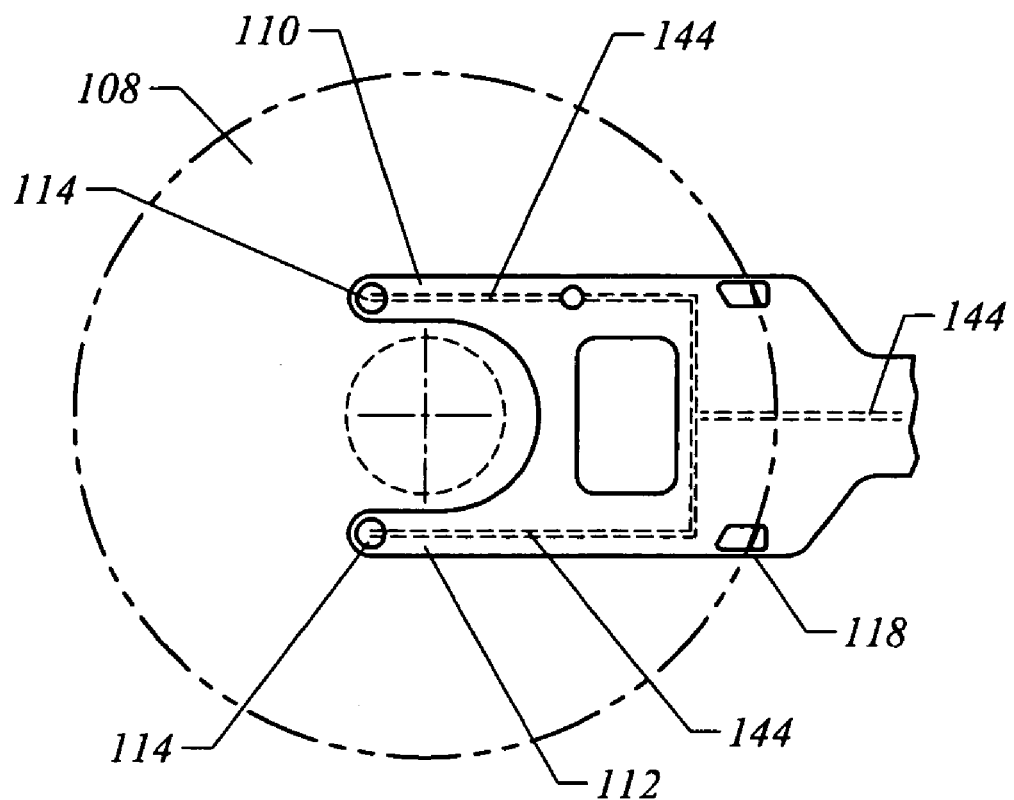
FIG. 5 is a top view of an embodiment of the present invention.
Figure 6:
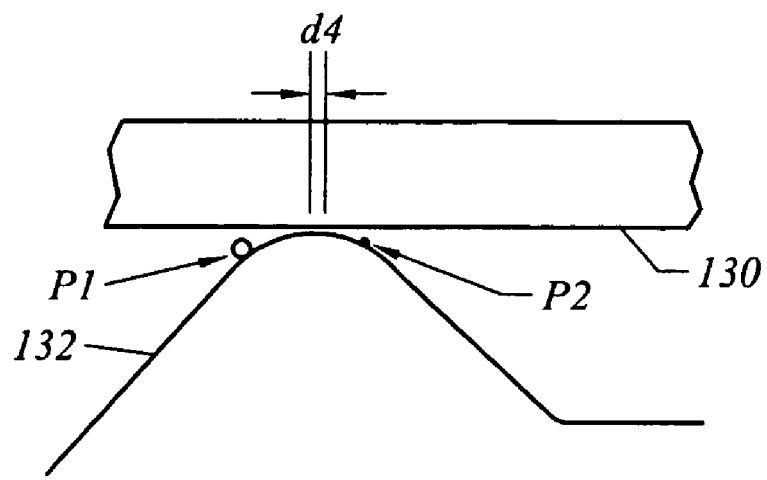
FIG. 6 is a side view of an embodiment of the present invention, illustrating the knife-like contact between a workpiece support and a wafer.

FIG. 5 illustrates one embodiment of a vacuum path 144 that provides a passageway between a vacuum source and the cavity located beneath each wafer support 114. The end effector 100 illustrated in FIG. 5 includes two wafer supports 114. It is within the scope and spirit of the invention for the end effector to include more or less than the two wafer supports 114.

FIG. 7 illustrates another embodiment of a wafer support. The wafer support includes a raised central peak 236, a clearance area 240 surrounding the raised central peak 236, and a raised edge 238. Vacuum is fed through the vertical holes in wafer support. The cross sectional area of the vertical holes is preferably greater than area between the raised edge 238 and the bottom surface of the wafer 130 (defined as a "leakage zone"). The central peak 236 is preferably the only area of contact between the wafer support and the wafer 108. The central peak 238 therefore provides a minimal contact area to support the wafer. The leakage zone creates a pressure drop across the raised edge 238 providing reduced pressure in the clearance area that holds the wafer down. The leakage zone may also create a Bernoulli effect—creating negative lift to hold the wafer down.

A second embodiment of a wafer support chuck is illustrated in FIG. 7. Instead of edge supports, the wafer support chuck 214 includes a center contact surface or ridge 232, or other support element geometries, to support the backside of the wafer. The center contact ridge 232 is the apex of the central region 234 of the wafer support chuck 214. One embodiment of the central region 234 comprises a conical section, as shown in FIG. 8, yet may comprise other geometries. The chuck concept could also be used in non-robotic applications, for example, on process or metrology wafer holding stations. The chucks could be arranged in a non-planar manner to produce a curved or cylindrical wafer surface.

FIG. 8 illustrates that the contact ridge 232 is preferably a rounded surface, having a radii R. Accordingly, the contact ridge 232 and the wafer's backside 130 form a contact area d. The wafer support chuck 232 also includes an outer contact area or ridge 236. The outer contact ridge 238 preferably does not contact the wafer's backside 130 when a wafer 108 is seated on the chuck 114 to minimize the contact area between the chuck 114 and the wafer 108. The outer ridge 236 may, however, contact the backside 130 if the wafer 108 or the chuck 114 tilts.

Each wafer support chuck 114 may comprise a wear resistant polymer such as, but not limited to, Teflon or PEEK. The difficulty of using such plastics is that the plastics are soft and easily damaged so that a seal between the contact area suction cups and the backside of the wafer is hard to achieve. This difficulty is generally compensated for by using a large contact surface area. But a large contact surface area is more likely to collect particles and pass them onto the wafer backside 130. In one embodiment, each chuck 114 includes a thin, knife-edge contact that is extremely flat at the contact point and is damage resistant. By using removable ridged rings or chucks as contact pads, a durable yet non-abrasive knife-edge thin contact seal can be achieved practically and cost effectively.

The wafer support chuck 114 may be made from a variety of materials. Desirable characteristics include low vapor pressure at temperature, high hardness, and inertness. Typical materials include metals such as stainless steel, crystals such as quartz, ruby, and sapphire, and ceramics such as silicon carbide, silicon nitride, and tungsten carbide. Because some of these materials are rather brittle and difficult to machine, cylindrically shaped pins of the correct axial length can be advantageously used in accordance with the invention. These materials exhibit a relatively high coefficient of friction and better "grip" the wafer during acceleration and deceleration of the end effector by the robot, protecting against slippage.

In an alternative embodiment, the end effector support plate 106 is milled or ground with three round areas 126 that are recessed. A vacuum is routed through the end effector 100 and terminates at the center region of the round pockets 126. Replaceable wafer supports are placed in the pockets and held with a thin adhesive. Alternatively, vacuum may be routed to each cup 126 independently so that a leak in one does not reduce the vacuum grip of the others.

The end effector 100 may be made of any suitable material. Desirable characteristics include low weight and structural stability at high temperature. Typical materials include metals, such as stainless steel, aluminum, titanium, molybdenum, ceramics, composites and combinations thereof. The end effector 100 can be manufactured from machined plate stock or can be pressed powder materials. Because the invention does not require bonding or otherwise attaching the wafer support chuck 114 to the end effector 100, any combination of pad material and end effector material can be used. Also, because the chucks 114 can be readily removed and replaced, worn or damaged, chucks 114 can be changed quickly, without rework of or damage to the end effector 2.

Several designs for the rings and chucks 114 and 116 are possible and could be selected depending on the demands of the application. An example of ring and chuck designs are:

Design #1: PEEK or another stable, strong, clean polymer is turned on a lathe into any number of shapes (see FIG. 10B). The thin contact edge may be flat and parallel with the bottom surface of the wafer.

Design #2: The same chuck may also be made out of metal, either on a lathe or with a forming process such as sintered powder forming. This metal base is then coated with a thin (e.g., less than 0.001") Teflon coating. The edge contact is far more durable and precisely flat than if the part were Teflon alone. A good seal can therefore be maintained with the backside of the wafer with a minimal contact area. In a preferred embodiment, only the non-abrasive chemically inert pure Teflon comes in contact with the wafer.

Design #3: A hard elastomer like 100 durometer Viton® is molded in any shape, or with a flat top. This is appropriate for applications requiring high grip strength where cleanliness is not as critical.

Because of the low contact area, the rings are more likely to wear out or become damaged than normal vacuum pads. This is mitigated by the fact that the rings are easily installed and removed and can be replaced during scheduled maintenance. To make removal of the rings easy, a hole is provided on the back side of the end effector for each ring so that each ring can be pushed out with a piece of wire (e.g., a paper clip).

The surface can then be cleaned and another ring installed. A thin double sided adhesive tape is attached to the bottom surface of the ring. The rings are provided on a backing sheet from which they can be easily removed without wrinkling the adhesive. They are then placed into the pocket that locates them centered over the vacuum hole.

Figure 10A:
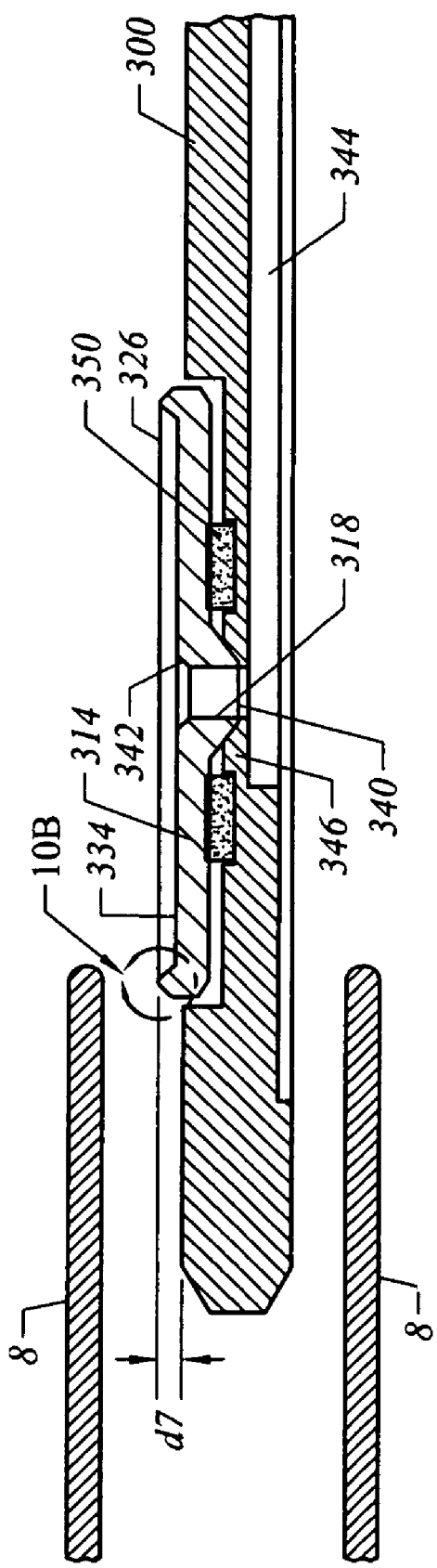
FIGS. 10A-10B illustrate yet another embodiment of the present invention.
Figure 10B:
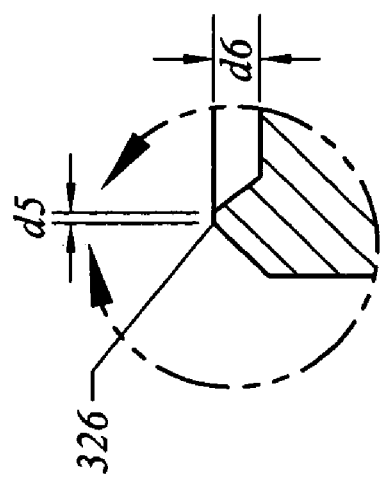

FIG. 10A illustrates another embodiment of a wafer support or chuck 314. The disc-shaped wafer support includes a central body 318 that extends outward into cantilevered body 326. The outer edge of the cantilevered body 334 transitions into a raised contact edge 326. As shown, the contact edge 326 of the wafer support is elevated a distance d7 above the top surface of the end effector 300. FIG. 10B illustrates that the contact edge 326 comprises a width d5 at the wafer contact surface and is raised a distance d6 above the cantilevered body 316. The distances d5 and d6 may vary. The contact area between the raised edge 326 and the backside of the wafer is preferably minimal. Thus, the distance d5 is preferably similar to the distance d4 shown in FIG. 4B. In this embodiment, the wafer support 314 is secured to the end effector by an adhesive device or ring 350.

The central body 318 includes a vacuum passage 342. The vacuum passage 342 aligns with the vacuum passage 340 in the end effector 300. The contact edge 326 of the wafer support 314 is preferably the only area of contact between the wafer support and the wafer 8. After the wafer 8 is placed on the wafer supports 314 of the end effector 300, a vacuum source (connected to the vacuum passage 344) reduces the pressure within the clearance area between the backside of the wafer and the cantilevered body 334 (e.g., the area defined by the distance d6 and the diameter of the raised contact edge 326). The vacuum zone creates a pressure drop within in the clearance area and holds the wafer down on the edge 326 of the wafer support.

FIG. 10B illustrates that the contact edge 326 has a flat top surface having a width d5. The top surface of the contact edge 326 may also comprise a rounded surface. Accordingly, the contact edge 326 only contacts the backside of the wafer 8 by the width d5.

FIG. 10 illustrates that the rings may be attached via a foam or otherwise compliant layer to allow the rings to tilt slightly to compensate for un-flat wafers or end effector paddles. The contact diameter of each ring is preferably large enough to hold a wafer securely on the end effector while the wafer is in transport. An end effector that includes two wafer supports, for example, requires that the contact diameter of each chuck be approximately 0.50" in order to prevent the wafer seated on the end effector from sliding off the end effector during transport.

Vacuum may be routed to each chuck independently so that a leak in one does not reduce the vacuum grip of the others.

For 200 mm cassettes and 300 mm FOSB, the end effector vertical profile is preferably less than 3-3.5 mm to be able to enter between wafers that are stacked in a cassette at ¼" or 6 mm pitch with acceptable clearances. It is very difficult to manufacture a ball and socket design using a separate socket bushing part and using an external retainer part that would fit in this profile.

The contact chuck is still made from relatively rigid plastic such as PEEK, PET, Ultem, Vespel, or Torlon (could also be metal or ceramic with appropriate surface treatment). It is supported via a compliant elastomer ring. The elastomer allows a small amount of angular tilt of the rigid chuck.

Figure 11:
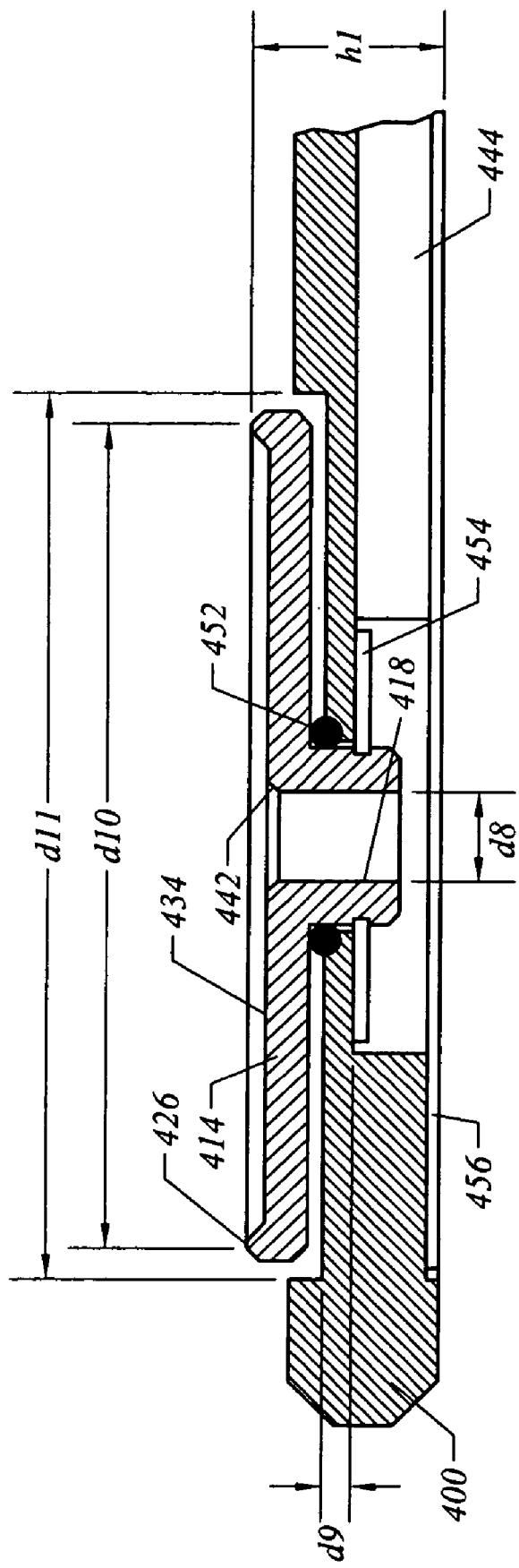
FIG. 11 is a side cut-away view of another embodiment of the present invention.

FIG. 11 illustrates another embodiment of a wafer support or chuck 414. The disc-shaped wafer support includes a central body 418 that extends outward into cantilevered body 434. The outer edge of the cantilevered body 434 transitions into a raised contact edge 426. As shown, the contact edge 426 of the wafer support is elevated above the top surface of the end effector 400 to prevent the wafer from contacting the end effector. Like the contact edge shown in FIG. 10B, the contact edge 426 comprises a flat or rounded contact surface and is raised above the end effector 400 when the support 414 is seated in the end effector bore. The diameter d10 of the support 414 is preferably less than the diameter d11 of the bore so that the support 414 is partially seated in the bore. Again, the contact area between the raised edge 426 and the backside of the wafer is preferably minimal.

The central body 418 includes a vacuum passage 442. In this embodiment, the central body 418 extends into the vacuum passage 444 of the end effector 400. The wafer support 314 is secured to the end effector 400 by a fastening device 454, which is secured to the central body 418 and has a diameter greater than the diameter of the central body 418 so that the support 414 cannot raise out of the bore in the end effector 400. In order to stabilize the support 414 within the bore, an o-ring 452 is placed around the central body 418 to prevent lateral movement of the support 414.

The contact edge 426 of the wafer support 414 is preferably the only area of contact between the wafer support and the wafer. After the wafer is placed on the wafer supports 414 of the end effector 400, a vacuum source (connected to the vacuum passage 444) reduces the pressure within the clearance area between the backside of the wafer and the cantilevered body 434. The vacuum zone creates a pressure drop within in the clearance area and holds the wafer down on the edge 426 of the wafer support.

Figure 9:
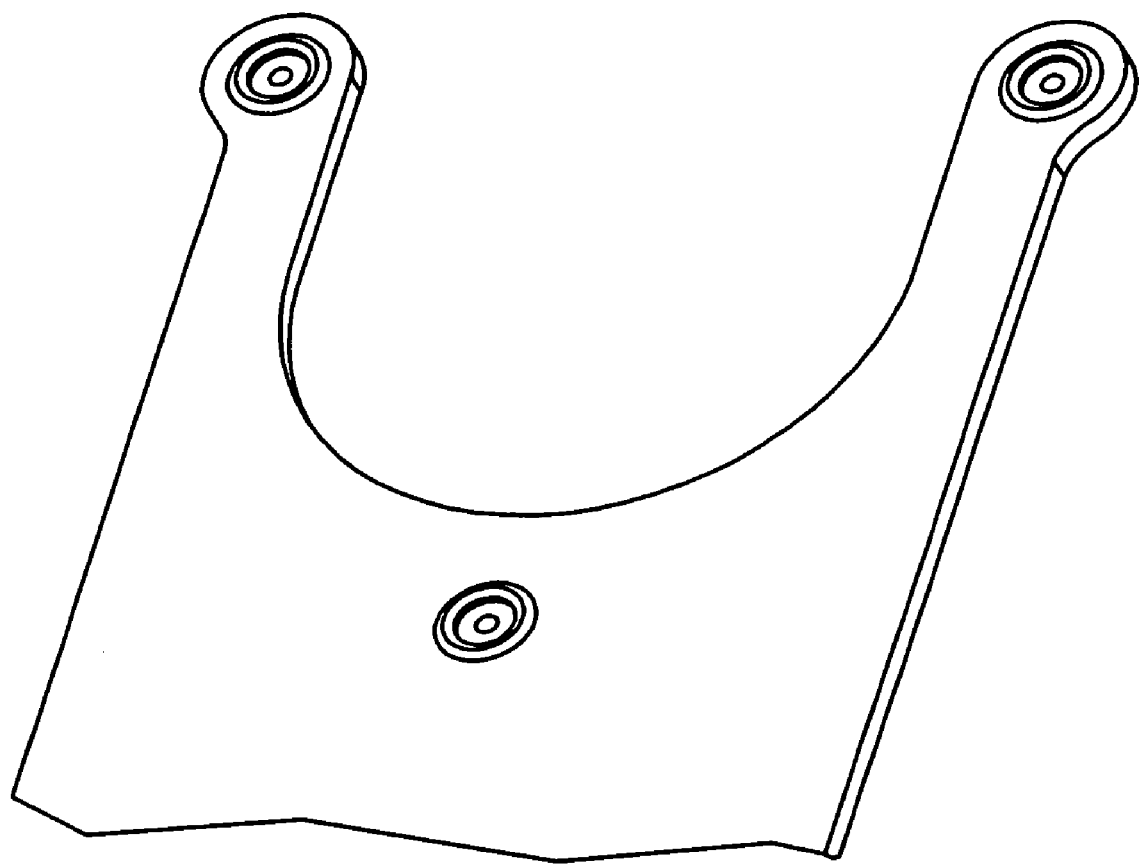
FIG. 9 illustrates another embodiment of a workpiece support, according to the present invention.

FIGS. 10-11 illustrate additional ways for a chuck to pivot as an alternative to the gimbaling ball and socket shown in the preferred embodiments. FIGS. 10-11 illustrate alternative lower profile and/or chucks that are cheaper to manufacture. These chucks comprise of deformable, yet still hard, material. These chucks, however, do not provide a full gimbaling range of motion (e.g., three degrees of freedom)—the chucks primarily tilt one way or another. FIG. 10 illustrates a foam ring that retains the wafer support. FIG. 11 illustrates an o-ring that retains the wafer support. The o-ring may snap into a groove or be secured to the end effector by a retaining ring or device. The foam ring and the o-ring allow the wafer support or chuck to flex or tilt. FIG. 9 provides a perspective view of the chucks shown in FIGS. 10-11 placed in an end effector.

In one embodiment, the elastomer is a foam ring with adhesive on both sides, such as 3M's VHB polyurethane foam tape with acrylic adhesive. The foam ring provides a seal and attaches the chuck to the support plate. The chuck is constrained in X, Y and Z directions by a ball in cone or ball in socket feature. As illustrated, the chuck has a small spherical protrusion which engages a conical surface in the support plate. In another embodiment, the elastomer is an o-ring. The chuck is retained by a standard retaining ring.

According to the invention, the end effectors can be made relatively thin, on the order of about 0.1 inches in thickness to accommodate high density semiconductor wafer storage cassettes. The end effectors can be sized to support and transport any size wafer, such as conventional 300 mm, 600 mm, and 900 mm diameter wafers. Also, the end effectors according to the invention are relatively light, minimizing the cantilever loading and resultant sagging or deflection of the robotic arm when fully extended to retrieve or replace a wafer in a storage cassette or carousel. Accordingly, the end effector can be accurately positioned and mishandling of wafers is minimized.

The foregoing description of preferred embodiments of the present invention has been provided for the purposes of illustration and description. It is not intended to be exhaustive or to limit the invention to precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiment and with various modifications as are suited to the particular use contemplated. It is intended that the scope of the invention be defined by the following claims and their equivalents.

The invention claimed is:

1. An end effector for transporting a semiconductor workpiece, comprising:
    a low-profile body having a proximal end and a distal end, said distal end including a recessed pocket in fluid communication with a vacuum channel passing through a portion of said low-profile body;
    a support pad partially seated within said recessed pocket, including:
        a central portion having a vacuum passage extending through; and
        a body extending outward from said central portion and transitioning into an elevated contact surface; and
    a retaining device having a first surface adhered to a portion of said recessed pocket and a second surface adhered to an underside of said body of said support pad.

2. The end effector as recited in claim 1, wherein said retaining device comprises a flexible elastomeric material.

3. The end effector as recited in claim 1, wherein said elevated contact surface comprises a circular geometry.

4. The end effector as recited in claim 1, wherein said first surface of said retaining device is adhered to a bottom surface of said recessed pocket.

5. The end effector as recited in claim 1, wherein said recessed pocket further includes a channel in a bottom surface of said recessed pocket.

6. The end effector as recited in claim 5, wherein said retaining device is seated within said channel.

7. The end effector as recited in claim 1, further including a second recessed pocket, not in fluid communication with said vacuum channel, located in said proximal end of said low-profile body.

8. The end effector as recited in claim 7, further including a second support pad partially seated within said second recessed pocket.

* * * * *